(12) United States Patent
Ramirez et al.

(10) Patent No.: US 6,299,693 B1
(45) Date of Patent: Oct. 9, 2001

(54) METHOD AND APPARATUS FOR ALIGNING A WAFER CHUCK IN A SEMICONDUCTOR WAFER PROCESSING PROCEDURE

(75) Inventors: Andres Roberto Ramirez; Roger DeLuna, Jr., both of San Antonio; Frank John Kanozik, III, Helotes, all of TX (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/213,751

(22) Filed: Dec. 17, 1998

(51) Int. Cl.[7] .............................. C23C 16/00; B65G 49/07
(52) U.S. Cl. .......................... 118/728; 118/500; 118/723
(58) Field of Search .................................. 118/728, 500, 118/723

(56) References Cited

U.S. PATENT DOCUMENTS

| | | | |
|---|---|---|---|
| 5,810,935 | * | 9/1998 | Lee et al. ............................... 118/728 |
| 5,874,361 | * | 2/1999 | Collins et al. ........................ 438/716 |

* cited by examiner

Primary Examiner—David Nelms
Assistant Examiner—Reneé R. Berry
(74) Attorney, Agent, or Firm—Ronald P. Kananen; Rader, Fishman & Grauer

(57) ABSTRACT

A chuck centering tool for aligning a wafer chuck in an edge bead rinsing device is made from disk which is substantially the same size as a semiconductor wafer. A circular recess centered on the center of the disk is made in the underside of the tool. The recess is sized to receive the end of the wafer chuck. With the tool in the place of a wafer on a wafer transport system, the chuck can be aligned to enter the recess. Thereafter, the chuck is properly aligned with respect to wafers on the transport system.

8 Claims, 4 Drawing Sheets

METHOD AND APPARATUS FOR ALIGNING A WAFER CHUCK IN A SEMICONDUCTOR WAFER PROCESSING PROCEDURE

FIELD OF THE INVENTION

The present invention relates to the field of semiconductor device manufacture. More particularly, the present invention relates to a method and apparatus for aligning a wafer chuck in a semiconductor wafer processing device.

BACKGROUND OF THE INVENTION

The manufacturing of semiconductor devices typically includes hundreds of different process steps performed on a semiconductor wafer. The steps include creating circuit patterns, introducing dopants, and depositing films on a silicon wafer repetitively throughout the manufacturing process. These steps result in the formation of circuit elements such as transistors, capacitors and resistors that are interconnected to form electronic circuits. The circuits on a semiconductor wafer may be designed to do anything from controlling an elevator to running a laptop computer to monitoring the systems of an automobile.

Because the various circuit elements and interconnections that are built on a semiconductor substrate or wafer are built one on top of another in a sequential manner, it is important that each layer of the structure be substantially defect-free before the next layer is added. Otherwise, a defect in one layer may cause irreparable malfunctions in adjacent layers.

Defects are generally caused when unwanted particulate matter which is present during the manufacture of the semiconductor device comes to rest on and is incorporated into the layers of material being deposited on the semiconductor wafer. For example, a conductive particle placed in the wrong place may electrically connect or bridge two circuit elements on the substrate that are not supposed to be connected. This may disable the affected circuit elements or cause them to function improperly. Alternatively, an unwanted particle may disrupt a connection that is supposed to exist between two circuit elements, thereby preventing the circuit from operating properly.

Thus, for lithographic circuit forming techniques at the submicron level, where the wiring features or patterns are less than one micrometer in width, the size of contaminant particulate matter that must be controlled and eliminated is between about one fifth to one tenth of a micrometer. Preventing particles of such diminutive size from invading the semiconductor manufacturing procedure is obviously very difficult.

Contamination by unwanted particles can best be avoided if the sources of such contaminants are eliminated. There are two major sources of contaminant particles that may be introduced into a semiconductor manufacturing process. The first is the environment in which the semiconductor wafer is processed, i.e., the equipment in and with which the wafer is processed, the ambient air surrounding the wafer, and gases or fluids that are used for various processes performed on the wafer during manufacture. These contaminants that are external to the wafer can generally be kept away from the wafer by the proper use of filters, and other precautions that are commonly known.

The second source of particle contaminants is the wafer itself. As the wafer is processed, particulate matter may be released from the wafer by abrasion or breakage resulting from stresses imposed on the wafer during the manufacturing process. For example, a wafer may be clamped down or held along its edges by wafer clamps during some stages of processing. This abrasion of the edges can cause particulate matter to break free. The freed matter then becomes a contamination hazard.

A common approach for controlling the amount of breakage or peeling of particulate matter from the edge of a wafer has been to chamfer the edge. This chamfering or rounding of the edge of the substrate before the wafer is processed has been successful in reducing the release of particles that would otherwise be generated from the substrate edge itself.

Moreover, in some semiconductor processing, the edge of the wafer acquires an extra bulge of material that can more easily break free and result in contaminating particles. For example, when dielectric spin-on-glass (SOG) is spun on a wafer, it tends to form a bead as it advances towards the edge of the wafer. This results in a bulbous piling of material at the edge of the wafer which can be a source of contaminants in subsequent processing. Other layers that are added to a wafer by spin coating may cause similar edge beads.

Consequently, the extra material that accumulates on the edge of the wafer, the edge bead, is removed by grinding or etching the circumferential portion of the wafer. This tends to reduce contaminants originating from the wafer's edge.

One known process for removing the edge bead caused by spin coating involves rinsing the edge of the wafer with a solvent to dissolve the unwanted edge bead. This process is known as edge-bead rinsing ("EBR"). The solvent is washed over the edge of the wafer until the bead is removed. Subsequent processing may then continue.

In an edge bead rinsing process, wafers are delivered individually to the rinsing device on a pair of parallel transport belts. A wafer chuck then engages each wafer and lifts it into the rinsing device where the edge bead rinsing takes place. It is critical to the rising process that the chuck engage the center of the wafer. If the chuck does not engage the center of the wafer, the rinsing to remove the edge bead will be uneven. For example, material that is not supposed to be removed may be rinsed from the wafer while portions of the unwanted edge bead remain.

At present, there is no device or method known for easily and precisely aligning the wafer chuck so as to engage the center of a wafer as delivered by the transport belts. A technician generally must align the wafer chuck by simply eyeballing its placement with respect to the transport belts. Moreover, with use, the wafer chuck tends to lose its alignment. Consequently, the chuck must be realigned, for example, weekly.

Therefore, there is a need in the art for an apparatus and method for readily and accurately aligning the wafer chuck to engage the center of each wafer as it is delivered on the parallel transport belts.

SUMMARY OF THE INVENTION

Consequently, it is an object of the present invention to meet the above-described needs and others. Specifically, it is an object of the present invention to provide an apparatus and method for readily and accurately aligning the wafer chuck to engage the center of each wafer as it is delivered on the parallel transport belts. Additional objects, advantages and novel features of the invention will be set forth in the description which follows or may be learned by those skilled in the art through reading these materials or practicing the invention. The objects and advantages of the invention may be achieved through the means recited in the attached claims.

To achieve the stated and other objects, the present invention may be embodied and described as a tool for aligning a wafer chuck in an edge bead rinsing device. The tool is a substantially circular substrate having a size substantially equal to the semiconductor wafers to be processed in the edge bead-rinsing device. The substrate also has a recess on the underside that is centered with respect to the substrate and sized to receive therein the wafer chuck when the wafer chuck is correctly aligned.

The tool preferably also includes a hole drilled in the center of the substrate and rectangular slots cut in opposite sides of the substrate corresponding to transport belts for transporting semiconductor wafers. The tool may be made of polypropylene and ¼ inch thick. Alternatively, the tool may be made from Delrin.

The present invention also encompasses a method of aligning a wafer chuck of an edge bead rinsing device by placing a substantially round centering tool at an end of a semiconductor wafer transport path; and aligning the wafer chuck to engage the tool in a recess sized to receive the wafer chuck. More particularly, the method includes placing the tool against stops provided at the end of the transport path; and aligning the two rectangular slots cut into opposite sides of the centering tool with two transport belts for transporting semiconductor wafers along the transport path.

In preparing the tool, the method includes centering the recess on an underside of the centering tool. The method also includes sizing the centering tool to have a size substantially equal to that of a semiconductor wafer and drilling a hole is a center of the centering tool.

The tool of the present invention may also be described as a means for designating the position of a semiconductor wafer with respect to a wafer transport path at a point along the path at which the wafer chuck is to engage semiconductor wafers. The means for designating also includes a means for indicating where the wafer chuck should engage a semiconductor wafer with respect to the transport path. The means for designating also includes means for aligning the means for designating with transport belts of the transport path.

BRIEF DESCRIPTION OF THE DRAWINGS

The accompanying drawings illustrate the present invention and are a part of the specification. Together with the following description, the drawings demonstrate and explain the principles of the present invention.

DETAILED DESCRIPTION OF THE PREFERRED EMBODIMENTS

Using the drawings, the preferred embodiments of the present invention will now be explained.

Figure 1:
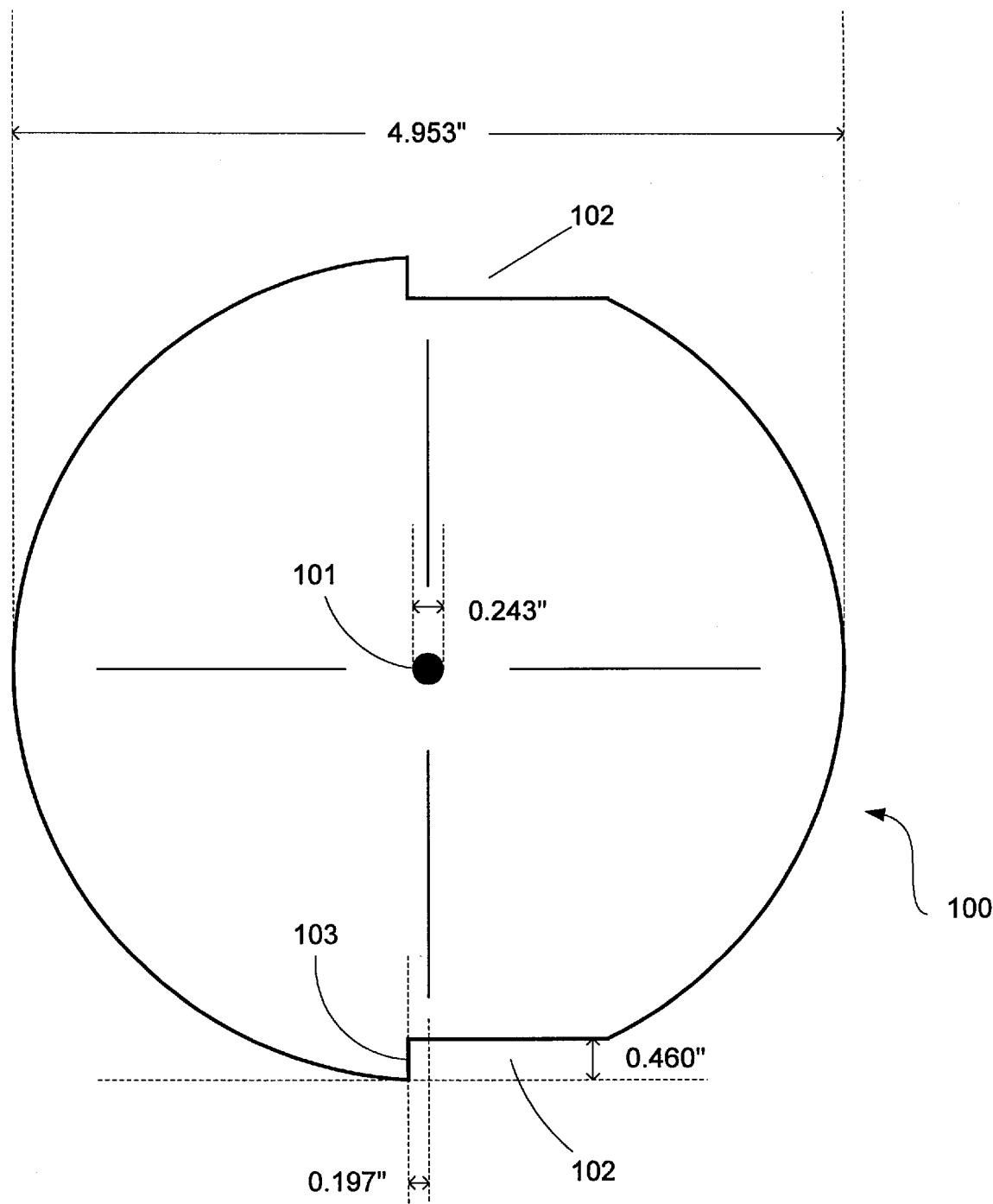
FIG. 1 is a top view of a chuck-centering tool according to the present invention.

FIG. 1 shows a top view of a chuck-centering tool 100 according to the present invention. As shown in FIG. 1, the chuck-centering tool 100 may be embodied as a disk-like substrate the size of a semiconductor wafer. The diameter of the tool is preferably 4.953 inches, corresponding to the size of a "5 inch" semiconductor wafer.

The tool 100 is preferably about ¼ inch thick and cut from, for example, polypropylene. Alternatively, the tool may be made of Delrin which is cleaner and more durable.

A hole 101 of 0.243 inches in diameter is drilled in the center of the tool 100. Two rectangular slots or chords 102 are cut in opposite side edges of the tool 100. The slots 102 have a width 103 of 0.460 inches and preferably extend from 0.197 inches past the center of the tool 100, back across the centerline of the tool 100, to the opposite edge.

Figure 2:
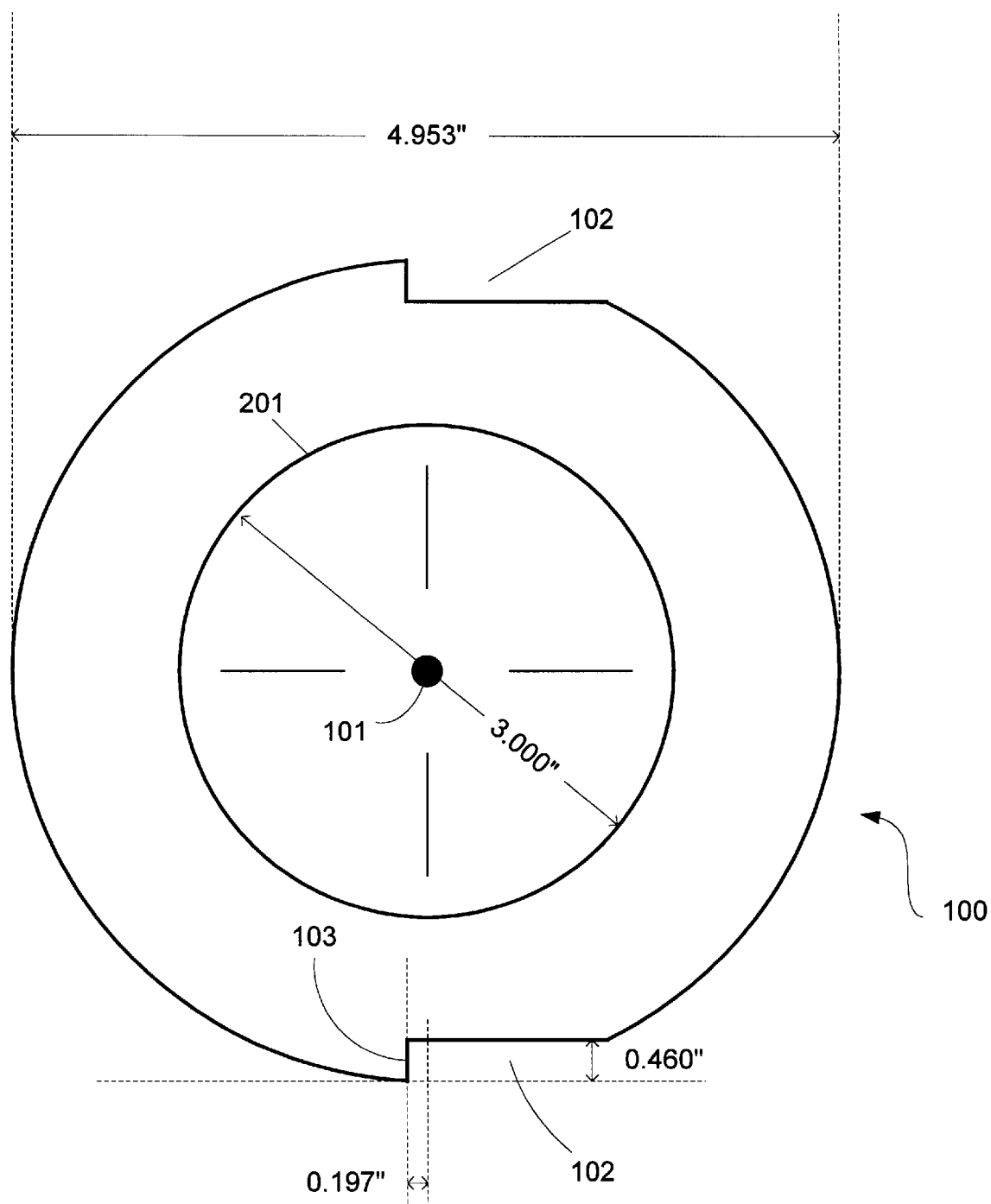
FIG. 2 is a bottom view of the chuck-centering tool of FIG. 1.

FIG. 2 shows a bottom view of the tool 100 according to the present invention. A circular recess 201, centered on the center 101 of the tool 100 is made in the underside of the tool 100. This recess 201 has a diameter of three inches and a depth of 0.080 inches. The size of the recess 201 is chosen so that the recess can receive the end of the wafer chuck of an edge bead rinsing system.

Figure 3:
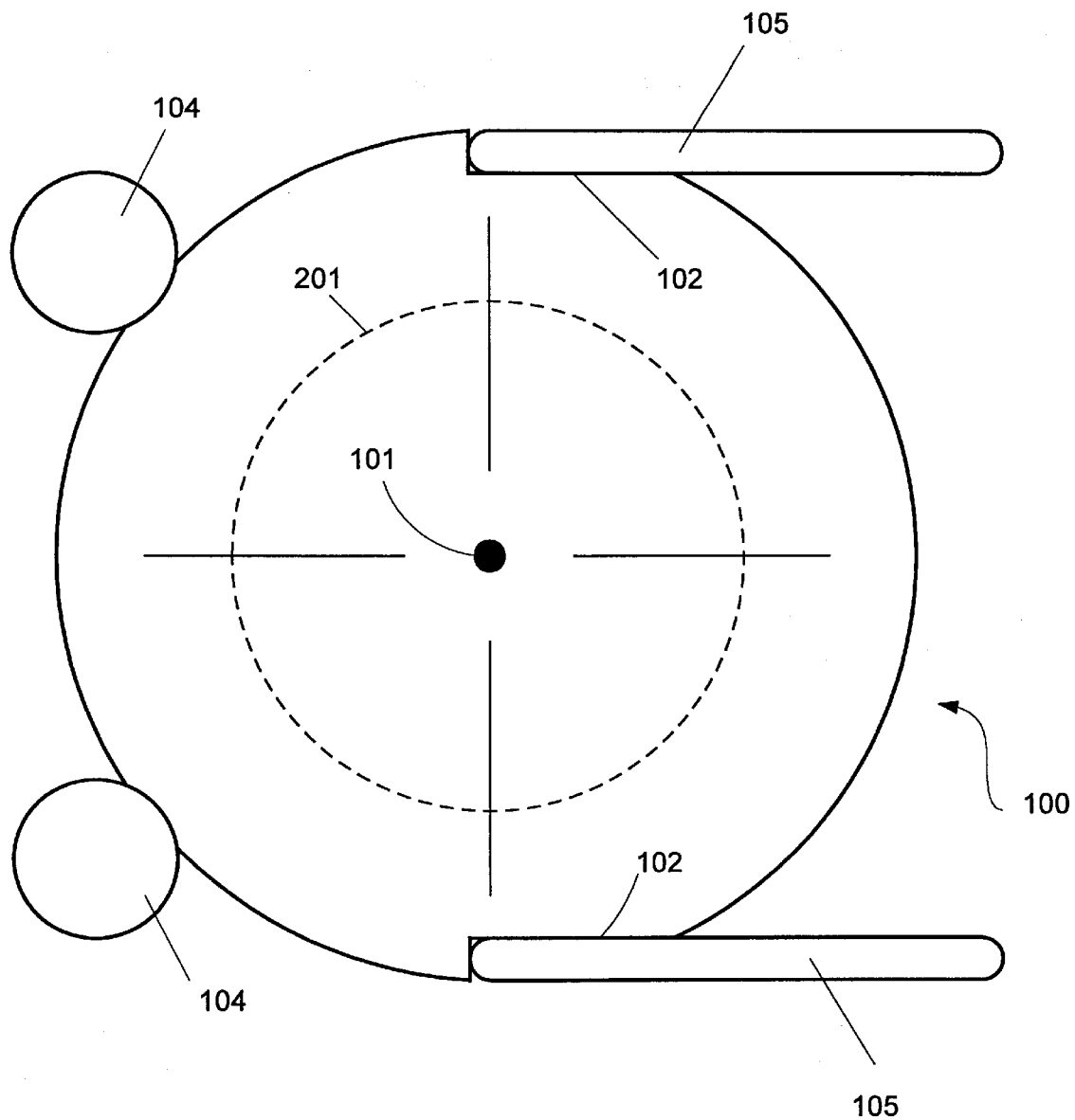
FIG. 3 is an illustration of the chuck-centering tool of the present invention as used to center the chuck of an edge bead-rinsing device.

The use of the centering tool 100 of the present invention will now be explained with reference to FIG. 3. As shown in FIG. 3, an edge bead rising device includes two parallel transport belts 105 that deliver individual wafers to the rinsing device. Two stops 104 are provided at the end of the transport path to stop the wafers being moved by the transport belts 105. After a wafer is stopped by the stops 104, the wafer chuck (not shown) engages the center of the wafer and lifts it into the rinsing device.

To center wafer chuck (not shown), the tool 100 is placed against the stops 104. The two slots 102 are aligned with the transport belts 105. The wafer chuck is then aligned so that it will be received in the recess 201 on the underside of the tool 100 when the chuck moves to engage the tool 100. (The recess 201 is shown in ghost in FIG. 3.)

When the chuck is so aligned, it will thereafter properly engage the center of wafers transported by the transport belts 105. The wafers can then be properly inserted by the chuck in the edge bead-rinsing device, and the edge bead can be properly rinsed from each wafer.

As will be understood by those skilled in the art, the center tool 100 of the present invention and the method of using it disclosed herein will allow a technician to quickly and accurately align the wafer chuck in an edge bead rinsing device. The alignment can be repeated as necessary.

In addition to the edge bead rinsing and similar coating processes described above, semiconductor wafers are also subject to a developing process. The developing is conducted after a wafer has been exposed to a pattern of light which represents a circuit layout to be formed on the wafer. The light pattern denatures portions of a photosensitive layer on the wafer. The pattern of light is then reflected in the photosensitive layer when that layer is developed.

The device for developing a semiconductor wafer includes a wafer chuck which engages a wafer and moves the wafer into the developer in the same manner that the chuck described above moves a wafer into a coating or edge bead rising device. Consequently, the principles of the present invention can be applied to centering the wafer chuck of a developer as well as that of a coating or rinsing device.

However, the wafer chuck of the developer may be of a different size than the wafer chuck of the coating device. Consequently, the centering tool of the invention can be made to fit either or both. Where the tool is made to fit both, a recess for engaging the chuck of the rinsing device is provided in the manner described above. Then, on the opposite or top side of the centering tool, another differently sized recess is provided which is sized to engage the wafer chuck of a developer.

Figure 4:
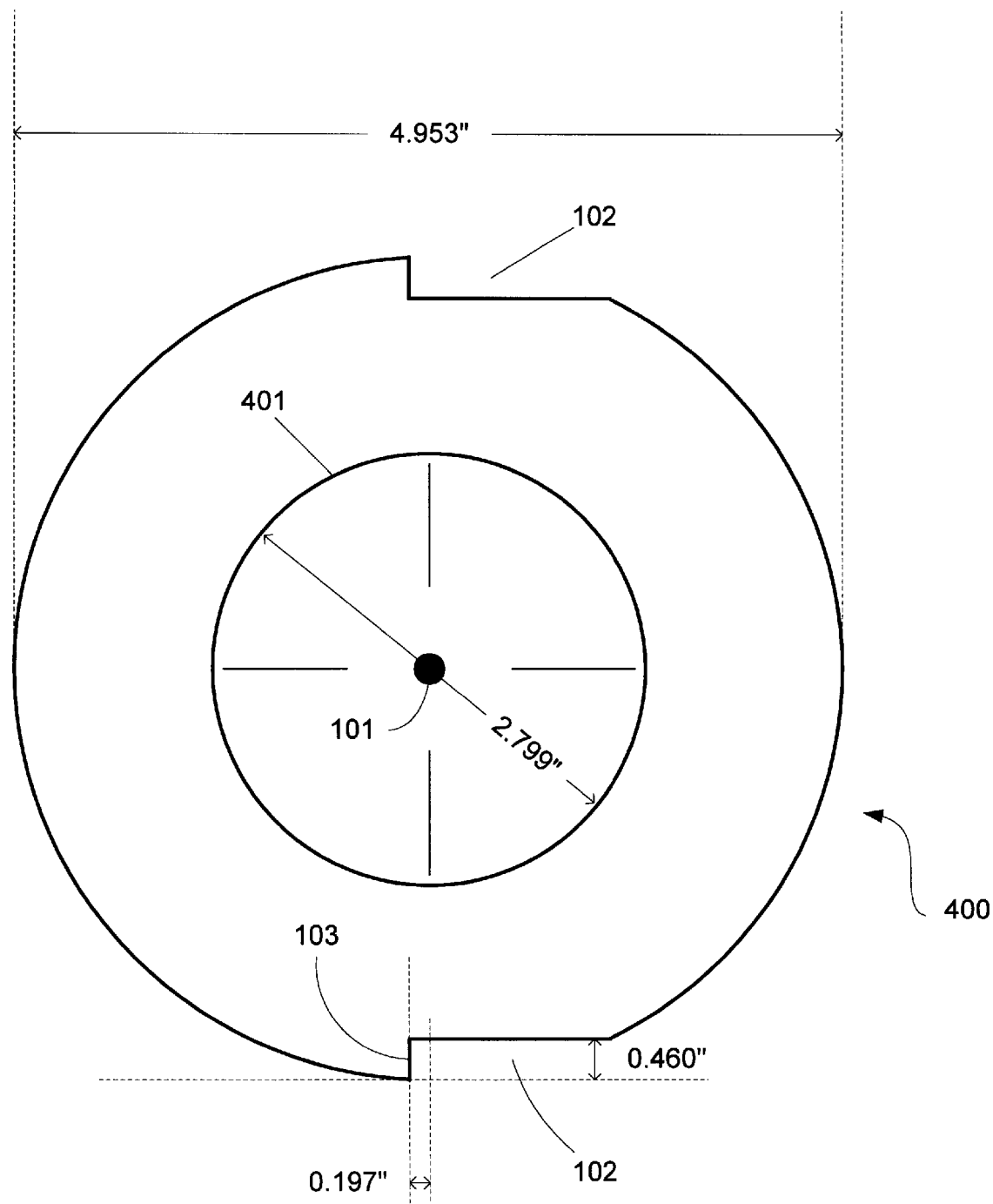
FIG. 4 is an illustration of a top view of an alternate embodiment of the chuck-centering tool of the present invention.

FIG. 4 illustrates a top view of a centering tool 401 having recesses on both sides. Those of skill in the art will understand that the underside of the tool 401 is identical to that illustrated in FIG. 2.

The tool 401 of FIG. 4 includes a recess 401 that has a diameter of 2.799 inches and a depth of, preferably, 0.050 inches. With these dimensions, the recess 401 will engage and properly center a wafer chuck for a semiconductor developer. Consequently, the tool 400 can be used to center the wafer chuck of either a rising/coating device or a developer device.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A tool for aligning a wafer chuck of a semiconductor processing device, the tool comprising:

a substrate having a substantially circular upperside surface of a size substantially equal to a semiconductor wafer to be processed in said processing device; and a first recess on an underside surface of said substrate, said recess being centered with respect to said substrate and being sized to receive therein said wafer chuck when said wafer chuck is correctly aligned.

2. The tool of claim 1, further comprising a hole drilled in the center of said substrate.

3. The tool of claim 1, further comprising rectangular slots cut in opposite sides of said substrate corresponding to transport belts for transporting semiconductor wafers.

4. The tool of claim 1, wherein said substrate is made of Delrin AF and is ¼ inch thick.

5. The tool of claim 1, wherein said substrate comprises a second recess on said upperside of said substrate opposite said first recess, said second recess being centered with respect to said substrate and being sized to receive therein a second wafer chuck with different dimensions from said first wafer chuck when said second wafer chuck is correctly aligned.

6. A device for centering a wafer chuck in an edge bead rinsing apparatus, the device comprising:

a means for designating the position of a semiconductor wafer with respect to a wafer transport path at a point along said path at which said wafer chuck is to engage semiconductor wafers; and a means, on said means for designating, for indicating where said wafer chuck should engage a semiconductor wafer with respect to said transport path.

7. The device of claim 6, further comprising means, on said means for designating, for aligning said means for designating with transport belts of said transport path.

8. The device of claim 6, further comprising a hole drilled in a center of said means for designating.

* * * * *